United States Patent [19]

Smith, III et al.

[11] Patent Number: 5,121,181
[45] Date of Patent: Jun. 9, 1992

[54] RESONANT TUNNELING PHOTODETECTOR FOR LONG WAVELENGTH APPLICATIONS

[75] Inventors: Theoren P. Smith, III, Yorktown Heights; Jerry M. Woodall, Bedford, both of N.Y.

[73] Assignee: International Business Machines Corporation, Armonk, N.Y.

[21] Appl. No.: 611,374

[22] Filed: Nov. 13, 1990

Related U.S. Application Data

[63] Continuation of Ser. No. 304,742, Jan. 31, 1989, abandoned.

[51] Int. Cl.⁵ .................. H01L 49/02; H01L 29/205; H01L 27/14; H01L 31/00
[52] U.S. Cl. .......................................... 357/30; 357/4; 357/16
[58] Field of Search ... 357/30 E, 4 SL, 16 U.S. only), 357/4, 16, 30

[56] References Cited

U.S. PATENT DOCUMENTS

| | | | |
|---|---|---|---|
| 4,203,124 | 5/1980 | Gordon et al. | 357/13 |
| 4,383,269 | 5/1983 | Capasso | 357/30 E |
| 4,390,889 | 6/1983 | Capasso et al. | 357/30 E |
| 4,471,370 | 9/1984 | Chen et al. | 357/30 E |
| 4,587,544 | 5/1986 | Webb | 357/16 |
| 4,616,241 | 10/1986 | Biefeld et al. | 357/16 |
| 4,631,566 | 12/1986 | Campbell et al. | 357/16 |
| 4,711,857 | 12/1987 | Cheng | 437/3 |
| 4,712,121 | 12/1987 | Yokoyama | 357/4 |
| 4,722,907 | 2/1988 | Weil et al. | 437/3 |
| 4,739,385 | 4/1988 | Bethea et al. | 357/16 |
| 4,761,680 | 8/1988 | Longeway et al. | 357/16 |
| 4,814,837 | 3/1989 | Kirchoefer | 357/16 |
| 4,826,295 | 5/1989 | Burt | 357/16 |
| 4,851,886 | 7/1989 | Lee et al. | 357/16 |
| 4,903,101 | 2/1990 | Maserjian | 357/30 |

OTHER PUBLICATIONS

C. J. Summers and K. F. Brennan, "New Resonant Tunneling Superlattice Avalanche Photodiode Device Structure for Long-Wavelength Infrared Detection," Applied Physics Letters 51, (1987) Jul. 27, No. 4, New York, N.Y.

Kevin Brennan and C. J. Summers, "The Variably Spaced Superlattice Energy Filter Quantum Well Avalanche Photodiode; A Solid-State Photomultiplier" I.E.E.E. Journal of Quantum Electronics, QE-23, (1987) Mar., No. 3, N.Y.

(List continued on next page.)

*Primary Examiner*—Jerome Jackson, Jr.
*Attorney, Agent, or Firm*—Bernard E. Shay; David Aker

[57] ABSTRACT

A long wavelength detector is formed by coupling a highly doped cathode to an anode through an undoped quantum well or superlattice filter structure. The absorption mechanism is free-carrier absorption in a heavily doped direct bandgap semiconductor (the cathode). The cathode material is preferably chosen such that the conduction band edge is lower than the conduction band edge of the material forming the well of the resonant-tunneling filter. The cathode material should also be semiconductor material of relatively narrow direct bandgap with low effective electron mass. The detector device is biased so that electrons pass through the filter structure by resonant tunneling. To stimulate conduction, incident radiation must have a frequency (i.e., photon energy) sufficient to boost the energy of the cathode electrons from the Fermi energy level of the cathode to the resonance energy level of the quantum-well filter. Thus, photons of incident radiation are absorbed in the cathode which may also be referred to as the photon absorber. In a second, voltage-tunable, embodiment a single quantum well filter having an undoped subband is disposed between a doped cathode and an anode structure. The single quantum well filter structure includes a quantum well with one or more subbands surrounded by two barrier regions. The detection frequency is changed by increasing or decreasing the bias slope of the conduction band which, in turn, moves the quantum well subband energy level relative to the cathode Fermi energy level.

15 Claims, 6 Drawing Sheets

U.S. PATENT DOCUMENTS

Y. L. Jiang and H. L. Hwang, "Field-Drifting Resonance Tunneling Through a-Si:H/a-Si$_{1x}$C$_x$:H Double Barrier in the p-i-n Structure" Japanese Journal of Applied Physics, 27 (1988) Dec., No. 12, Part 2, Tokyo, Japan.

B. F. Levine, R. J. Malik, J. Walker, K. K. Choi, C. G. Bethea, D. A. Kleinman and J. M. Vandenberg, "Strong 8.2 μm Infrared Intersubband Absorption in Doped GaAs/AlAs Quantum Well Waveguides," Appl. Phys. Lett. 50 (5) (Feb. 2, 1987), p. 273.

B. F. Levine, K. K. Choi, C. G. Bethea, J. Walker and R. J. Malik, "New 10 μm Infrared Detector Using Intersubband Absorption in Resonant Tunneling GaAlAs Superlattices," Appl. Phys. Lett. 50 (16) (Mar. 20, 1987), p. 1092.

B. F. Levine, K. K. Choi, C. G. Bethea, J. Walker and R. J. Malik, "High Responsivity Long Wavelength ($\lambda = 10$ μm) GaAs/Al$_x$Ga$_{1-x}$As Multiquantum Well Superlattice Tunneling Detector", Device Research Conference, Univ. of Calif. at Santa Barbara (Jun. 22–24, 1987).

K. K. Choi, B. F. Levine C. G. Bethea, J. Walker and R. J. Malik, "Multiple Quantum Well 10 μm GaAs/Al$_x$Ga$_{1-x}$As Infrared Detector with Improved Responsivity", Appl. Phys. Lett. 50 (25) (Jun. 22, 1987), p. 1814.

B. F. Levine, K. K. Choi, C. G. Bethea, J. Walker and R. J. Malik, "Quantum Well Avalanche Multiplication Initiated by 10 μm Intersubband Absorption and Photoexcited Tunneling," Appl. Phys. Lett. 51 (12) (Sep. 21, 1987), p. 934.

B. F. Levine, A. Y. Choi, J. Walker, R. J. Malik, D. A. Kleinman and D. L. Sivco, "InGaAs/InAlAs Multiquantum Well Intersubband Absorption at a Wavelength of $\lambda = 4.4$ μm," Appl. Phys. Lett 52 (18) (May 2,1988), p. 1481.

K. K. Choi, B. F. Levine, C. G. Bethea, J. Walker and R. J. Malik, "Negative Differential Photoconductance in an Alternately Doped Multiple Quantum Well Structure," Appl. Phys. Lett. 52 (23) (Jun. 6, 1988), p. 1979.

G. H. Döhler, H. Künzel and K. Ploog, "Tunable Absorption Coefficient in GaAs Doping Superlattices," Physical Review B, vol. 25, No. 4 (Feb. 15, 1982), p. 2616.

E. R. Gertner, S. H. Shin, D. D. Edwall, L. O. Bubulac, D. S. Lo and W. E. Tennant, "High–Performance Photovoltaic Infrared Devices in Hg$_{1-x}$Cd$_x$Te on GaAs," Appl. Phys. Lett 46 (9) (May 1, 1985), p. 851.

D. L. Smith and C. Mailhiot, "Strained Type II Superlattices," Surface Science Vol. 196, pp. 683–686 (1988).

H. Pohlack, "Optically Enhanced Schottky Barrier Photodetectors for IR Image Sensor Application," Phys. Stat. Sol. (a) 97 (1986) p. k211.

E. E. Mendez, "Physics of Resonant Tunneling in Semiconductors," Physics and Applications of Quantum Wells and Superlattices, ed. by E. E. Mendez and K. von Klitzing, Plenum Press, New York, pp. 159–188 (1987).

P. J. Price, "Physics of Resonant Tunneling in Heterostructures," presented at the Workshop on Quantum Wells and Superlattices, Shanghai, Oct. 1988, (IBM Research Division, T. J. Watson Research Center).

RESONANT TUNNELING PHOTODETECTOR FOR LONG WAVELENGTH APPLICATIONS

This is a continuation of application Ser. No. 07/304,742, filed Jan. 31, 1989, now abandoned.

FIELD OF THE INVENTION

The present invention relates, in general, to long wavelength photodetectors and, more particularly, to infrared detectors employing undoped superlattice filter structures.

BACKGROUND ART

Short wavelength devices (e.g. those sensitive to wavelengths in the near infrared, visible or ultraviolet range below 1.5 μm) are relatively common. Because these devices do not require narrow bandgap materials, it is possible to use materials which are well known and easily integratable. To detect longer wavelength (lower energy) radiation with wavelengths above 7 μm such as infrared radiation, it is necessary to use either narrow bandgap materials, wider bandgap materials in which material is strained to narrow the bandgap or specialized structures which simulate the absorption properties of narrow band materials. The detection frequency or detection wavelength is the frequency or wavelength of the radiation which the detector is designed or tuned to detect (i.e., the frequency or wavelength which generates desirable photocurrent in the device).

As an example of an avalanche detector which operates on the principle of interband absorption in wide bandgap materials see U.S. Pat. No. 4,203,124 which describes a multi p-n junction device adapted to detect wavelengths in the 1.0 to 1.5 μm spectrum. Detection is accomplished by interband absorption. U.S. Pat. No. 4,722,907 describes an avalanche photodetector (APD) device adapted to detect wavelengths in the 1.0-1.5 near infrared spectrum. This device also works by interband absorption in wide bandgap materials and includes superlattice avalanche multiplication control. As an example of a p-i-n strained layer superlattice photodiode adapted to detect wavelengths in the visible spectrum see U.S. Pat. No. 4,616,241. This device operates on the principle of interband absorption in wide bandgap materials by strained-layer superlattices.

In the prior art, long-wavelength photodetectors, i.e., detectors adapted to detect wavelengths in the infrared (greater than 7 μm) spectrum, relied primarily upon either interband absorption in narrow bandgap materials, interband absorption by strained-layer superlattices, or intersubband absorption in doped superlattices or multi-quantum-well detectors as the primary detection mechanism.

As an example of a long wavelength detector which operates on the principle of intraband absorption in doped superlattices or multi-quantum well detectors see U.S. Pat. No. 4,711,857. Rather, than relying on intersubband absorption, this device detects incident radiation by photoexcitation of majority carriers. Current flows when the incident radiation is sufficient to excite carriers with sufficient energy to exceed the quantum barriers.

Another device for the detection of long wavelength radiation is a metal-semiconductor interface device which operates on the principle of internal photoemission. This is a majority carrier device. See, for example, "Optically Enhanced Schottky Barrier Photodetectors for IR Image Sensor Application," by H. Pohlack in *Phys. Stat. Sol.*, (a) 97, pp. K211–K215 (1986).

Interband absorption devices utilize narrow bandgap materials such as HgCdTe. The use of interband absorption is an old idea and fairly mature. Its primary drawbacks are the poor material properties of narrow bandgap materials such as the HgCdTe family, and the fact that these materials are extremely difficult to use in fabricating arrays which can be addressed or integrated with other electronic devices. These are minority carrier devices. See, for example, "High-Performance Photovoltaic Infrared Devices in $Hg_{1-x}Cd_xTe$ on GaAs," by E. R. Gertner, S. H. Shin, D. D. Edwall, L. O. Bubulac, D. S. Lo and W. E. Tennant in *Appl. Phys. Let.*, Volume 46, No. 9, pp. 851–853 (May 1, 1985).

Intersubband absorption (discussed in detail herein below) devices are relatively new and may be constructed using, for example, a GaAs-AlGaAs multi-quantum-well structure. These devices rely on optically active superlattice structures to detect incident radiation of an appropriate wavelength. These are majority carrier devices.

In long wavelength (e.g., greater than 7 μm) detectors, doped superlattice structures function effectively as detectors and have advantages over interband absorption devices where integration of devices is important. Integration is difficult on other types of prior art devices because of the materials processing problems encountered. In addition to materials problems, the drawbacks to using most prior art detectors, including doped superlattice structures, include large dark currents and a lack of voltage tunability. An additional problem in some doped superlattice structures is the very small solid angle of detection. Those devices that rely on intersubband absorption must be oriented at a specific angle to the incident radiation to increase their sensitivity. Additionally, devices which rely on minority carrier conduction tend to be slower than those which rely on majority carrier condition.

Of all the problems listed above, the problem of dark current is the most troubling. The large dark currents characteristic of prior art detectors are primarily a result of thermal energy in the device. In most of these prior art devices the magnitude of dark current makes it difficult to distinguish it from the desired photo current. Thus dark current substantially limits the sensitivity of these devices. This problem may be aggravated by the avalanche effect. Because the primary component of dark current is thermal excitation of the electrons into a conduction state, and because no effective means has been found to filter the dark current component, the primary method of controlling dark current is by lowering the thermal energy. One known way to lower the thermal energy and thus limit dark current is to cool the detector to cryogenic temperatures. Cooling reduces thermal excitation of carriers and the current generated thereby. However, cryogenic cooling is expensive and requires complicated heat transfer apparatus.

Another problem with most prior art devices is that the detection frequency is a function of the device structure and materials characteristics. Therefore, the detection frequency is fixed once the device is manufactured and cannot be changed by, for example, adjusting the bias voltage. Most long wavelength detectors are constrained by their structure and detection mechanism to operate at a fixed detection frequency and are, therefore, not tunable. One exception is the n-i-p-i structure (currently used for less than 1.0 μm applications) which is voltage-tunable. See, for example, "Tunable Absorption Coefficient in GaAs Doping Superlattices," by G. H. Dohler, H. Kunzel and K. Ploog in *Physical Review B*, Vol. 25, No. 4, pp. 2616–2626 (Feb. 15, 1982). Since the detection mechanism in the n-i-p-i structure is indirect real space transitions between the conduction and valence band, it may be tuned by changing its bias voltage. Changing the bias voltage across the device changes the energy separation between the valence and conduction band of neighboring doped regions. However, this type of device is not known to be adaptable to long wavelength applications.

Thus it would be advantageous to provide a fast, integratable, highly sensitive, long wavelength detector which filters out a substantial portion of the undesirable dark current without substantially attenuating the desirable photocurrent. In addition, it would be advantageous to provide a long wavelength detector which is electrically tunable over a range of detection frequencies. It would also be advantageous to provide a long wavelength detector which functions over a large solid angle of incident radiation, including orthogonal radiation. Finally, it would be advantageous to provide an integratable, highly sensitive, long wavelength detector which operates by majority carrier conduction.

A GaAs-AlGaAs doped superlattice structure which operates on the principle of intersubband absorption is described by Levine et al. in their paper entitled "New 10 $\mu$m Infrared Detector using Intersubband Absorption in Resonant Tunneling GaAlAs Superlattices," B. F. Levine et al., Appl. Phys. Lett. 50 (16), Apr. 20, 1987. This detector is intended to overcome the problems associated with integration of long wavelength detectors with electronic circuits by using a doped $Al_{x}Ga_{1-x}As$ superlattice structure for detection which relies on intersubband absorption. According to the article, the Levine et al. detector is intended to achieve long wavelength (10 $\mu$m) infrared sensitivity using Group III-V semiconductor materials, rather than the less technologically advanced $Hg_xCd_{1-x}Te$ alloys. In the Levine device, the doping in the cathode and anode is necessarily limited to prevent absorption of light and large dark currents. What doping there is facilitates current transport to and from the device. Thus, the optically active component of the Levind et al. device is the doped, superlattice portion in which the photocurrent results from intersubband excitation of free carriers.

However, intersubband absorption has inherent drawbacks which prevent the Leving et al. device from achieving optimum results. First, because of the principle of operation of this device, it must be biased to a voltage that is close to that which causes avalanche breakdown, a condition in which the electric field causes multiplication of thermally generated dark current carriers, before efficient photodetection occurs. Thus, this device has relatively large "dark current," i.e., noise, when biased in its optimal operating condition. Second, since the intersubband absorption vanishes if light is normally incident on the layers forming the quantum wells, the detector must be oriented at Brewster's angle to maximize the sensitivity. Thus, this detection scheme is only sensitive over a very limited solid angle.

FIG. 1 illustrates an unbiased two-well quantum lattice device including an anode 10, cathode 12, quantum wells 14 and barrier regions 16, which will be described for convenience. $E_f$ is the Fermi energy level of cathode 12. $E_c$ is the conduction band energy level. The quantum wells 14 of prior-art intersubband absorption devices (e.g. the Levine et al. device), while they could be constructed of essentially the same materials as the present invention, are doped to provide electrons in (at least) the lowest energy quantum-well subband 18 (henceforth referred to as lower subband). Higher energy subbands depleted of free carriers 20 are also included. Further, barrier regions 16 are thick enough to prevent substantially all elelctron tunneling.

When a doped superlattice device is biased as in FIG. 2, an electron excited from the lower subband 18 of a quantum well to the higher energy subband 20 will tunnel more easily through the device because the width of the barrier 16 is decreased by the bias slope 24 and the upper subband is closer to the top of the barrier. The bias slope 24 is induced by placing a DC potential across the device. Therefore, when an electron is excited from the lower subband 18 to the upper subband 20 (e.g., by irradiating the device), it travels easily from the quantum wells to the anode. As the electrons travel from one quantum well to the next, they can create an avalanche effect (especially if the device is biased to enhance avalanche), increasing the current in the device exponentially.

FIG. 3 illustrates intersubband absorption wherein added energy (e.g., photon energy in the form of incident radiation) causes an electron to jump from the lowest 18 to a higher energy subband 20, allowing the electron to escape from the quantum well 14 and causing a current to flow.

Therefore, to induce current flow, energy added to the device, for example, by irradiating it, must be sufficient to cause the electrons to jump from the lowest energy subband to a higher energy subband. Therefore, the photon energy of the incident radiation must equal the energy required to elevate an electron from one subband to the next. As radiant energy travels through the device, photons are absorbed in each of the quantum wells, causing each quantum well to contribute to the device current. More specifically, when light of an appropriate wavelength passes through the device, it gives up energy to the electrons in each quantum well. Thus, each quantum well creates its own current, which can be amplified by an avalanche effect. This is an example of intersubband absorption in doped multi-quantum-well detectors. In these devices it is the quantum well structure which is photo-sensitive and detects the incident radiation.

It will be noted that the response of an intersubband detector and of most other long wavelength detectors is not symmetrical around the detection frequency. That is, while it may be very responsive to incident radiation with frequencies above the frequency of interest, its response falls off rapidly at frequencies below the frequency of interest. Thus, broadband or shorter wavelength incident radiation may include wavelengths below the detection frequency with photon energies sufficient to cause the electrons in the lower subband to escape over the barrier layers, causing an undersirable photo current to flow. This higher frequency (higher energy) radiation may be filtered before striking the detector (e.g., by placing a filter with a cut-off frequency at approximately the detection frequency in front of the detector). Radiation with frequency below the detection frequency is filtered by the device because the photon energy is not sufficient to enable an electron to jump from the doped subband over the barrier and, therefore, does not induce current flow. It will be noted that it may be difficult to filter the frequencies immediately above the detection frequency without reducing the detector's sensitivity to wavelengths at the detection frequency. Further, it is extremely difficult to effectively filter shorter wavelength radiation while tuning the detector to adjust the detection frequency.

In addition to the desirable current induced in the detector by incident radiation, undesirable currents are also induced by various mechanisms. In all prior art devices undesirable current components may be developed in any of the active regions (e.g., in the doped quantum wells) by extraneous energy sources (primarily thermal and electric field sources) even in the absence of incident radiation. This undesirable current is referred to as dark current. In many of these devices the undesirable dark current could be multiplied and avalanched. Further, these devices are not adapted to limit the dark current to any specific energy level (e.g., the photon energy of the detection frequency), resulting in a large, broad band dark current which reduces the device's sensitivity. Thus, for the detector to be useful, the added energy due to incident radiation at the detection frequency must be sufficient to be detected or extracted from the dark current.

A significant dark current may also result from resonant tunneling. In a biased doped superlattice, where the quantum wells are doped and thus contain free carriers (e.g. electrons or holes), alignment of the quantum well subbands, as in FIG. 4, will result in a resonant tunneling current. The level of dark current and the quantum efficiency of the detector increase with doping level in the quantum wells, which is also proportional to the detector sensitivity. Thus, the more sensitive the detector, the greater the dark current problem.

A similar phenomenon occurs where the cathode is doped and, because of the bias, the Fermi level of the cathode meets or exceeds the aligned subbands. This will cause the free carriers in the cathode to flow as current. Thus, in doped superlattice detectors resonant tunneling is an undesirable effect which adds to the dark current. FIG. 5 illustrates an intersubband absorption device with a large doping concentration in the cathode which is biased to ensure resonant tunneling.

A significant disadvantage of some doped superlattice structures is the limited solid angle of detection. In doped superlattice structures relying on intersubband absorption for detection, it is necessary for optimal operation that the incident light hit the device at an appropriate angle (Brewster's angle). Otherwise, the incident radiation will not give up photon energy to each quantum well. If the radiation does not hit the device at Brewster's angle or some small variation thereof (e.g., if it enters the detector orthogonal to the quantum wells) the electric field (the E field) of the incident radiation will be perpendicular to the matrix elements. Thus, the energy component required to boost the electrons from the lowest subband energy to higher energy subbands is zero (i.e., there is no intersubband absorption in the quantum wells).

In a doped superlattice relying on intersubband absorption, the level of doping in the cathode must be limited since it is normally composed of the same material as the quantum wells. Doping the cathode causes its Fermi level to rise to a point where current could flow without photoexcitation, reducing the device's sensitivity substantially. This can be seen in FIG. 4 where the Fermi level is only slightly above the lowest subband of the cathode. Introducing any further doping as in FIG. 5 would raise the Fermi level to the point where resonant current may flow continuously.

SUMMARY OF THE INVENTION

In one embodiment of the present invention, a long wavelength detector is formed by coupling a highly doped cathode to an anode through an undoped quantum well or superlattice filter structure. The absorption mechanism of a detector according to the present invention is free-carrier absorption in a heavily doped direct bandgap semiconductor (the cathode). The cathode material is preferably chosen such that the conduction band edge is lower than the conduction band edge of the material forming the well of the resonant-tunneling filter. The cathode material should also be semiconductor material of relatively narrow direct bandgap with low effective electron mass. This has two advantages: First, low effective electron mass means that the free-carrier absorption is stronger. Second, the lower conduction band edge means that the cathode can be heavily doped without contributing significant dark current. A detector according to the present invention device is biased such that electrons pass through the filter structure by resonant tunneling. To stimulate conduction, incident radiation must have a frequency (i.e., photon energy) sufficient to boost the energy of the cathode electrons from the Fermi energy level of the cathode to the resonance energy level of the quantum-well filter. Thus, photons of incident radiation are absorbed in the cathode which may also be referred to as the photon absorber.

In a second, voltage-tunable, preferred embodiment of the present invention, a single quantum well filter having an undoped subband is disposed between a doped cathode and an anode structure. The single quantum well filter structure includes a quantum well with one or more subbands surrounded by two barrier regions. The detection frequency is changed by increasing or decreasing the bias slope of the conduction band which, in turn, moves the quantum well subband energy level relative to the cathode Fermi energy level.

It is therefore an object of the present invention to provide a long wavelength detector with reduced dark current components.

It is a further object of the present invention to provide a long wavelength detector with an undoped quantum well or superlattice filter element.

It is a further object of the present invention to provide a long wavelength detector with a heavily doped semiconductor cathode.

It is a further object of the present invention to provide a long wavelength detector which detects incoming radiation by intraband absorption of free carriers in the cathode.

It is a further object of the present invention to provide a long wavelength detector which includes an electrically active, optically inactive filter structure coupled to an electrically active, optically active semiconductor structure.

It is a further object of the present invention to provide a long wavelength detector which includes an electrically active, optically inactive filter structure which filters out frequencies above and below the detection frequency without substantially attenuating the detection frequency.

It is a further object of the present invention to provide a long wavelength detector where the detection frequency may be changed by varying the voltage bias between the anode and cathode.

It is a further object of the present invention to provide a long wavelength detector which may be electrically tuned over a range of detection frequencies.

It is a further object of the present invention to provide a long wavelength majority carrier detector.

It is a further object of the present invention to provide a long wavelength detector including a cathode with a low effective electron mass.

It is a further object of the present invention to provide a long wavelength detector which, when biased for detection, is not biased near the avalanche voltage of the detector.

BRIEF DESCRIPTION OF THE DRAWINGS

The novel features of the invention are set forth with particularity in the appended claims. The invention itself, however, both as to organization and method of operation, together with further objects and advantages thereof, may best be understood by reference to the following description taken in conjunction with the accompanying drawings in which:

DETAILED DESCRIPTION OF THE INVENTION

Figure 6:
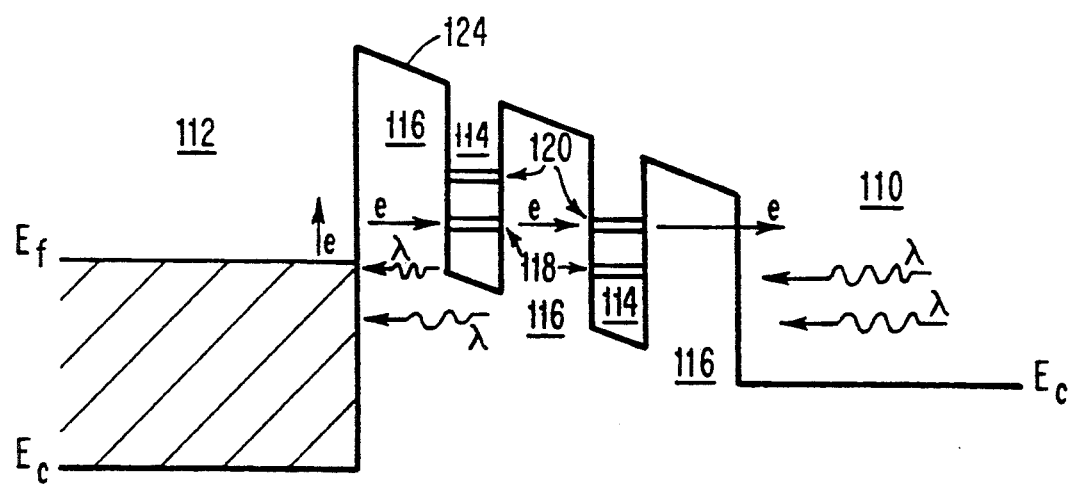
FIG. 6 illustrates a conduction band diagram of a two-quantum well device according to the present invention.

An understanding of the present invention may be had by reference to the two-quantum well, three-barrier device illustrated in FIG. 6. FIG. 6 illustrates an biased two-well quantum lattice device including an anode 110, cathode 112, quantum wells 114 and barrier regions 116. The quantum wells 114 are undoped and contain at least two subbands: a lowest energy quantum well subband 118 and a higher energy quantum subband 120. The device is doped to provide bias slope 124 which resonantly biases the device such that the subbands are aligned in subsequent quantum wells.

In the present invention the quantum wells of the filter are undoped while the cathode is heavily doped; therefore, none of the subbands in the filter quantum wells contain free electrons. The electron current flow in the present invention results from biasing a device according to the present invention, as in FIG. 6, such that a subband of the first quantum well is either aligned with a subband of the subsequent quantum well, or exceeds the energy of a subsequent barrier. The filter is thus biased to allow resonant tunneling of photoexcited electrons. By exciting electrons in the heavily doped cathode region, their energy is raised to the level of the first quantum well state (i.e. subband) and can travel through the device by means of resonant tunneling. Resonant tunneling occurs where the subbands of each subsequent quantum well are aligned, causing the resonant filter to appear to be transparent to an electron traveling therethrough. This phenomenon results from phase coherence of the electrons in the quantum wells. Because the quantum wells are undoped, the barrier layers may be thin enough to effectively allow electron tunneling through a single barrier since the total effective length of the barrier path will prevent tunneling of current from the cathode to the anode.

The filter structure of the present invention operates by resonant tunneling of carries which are generated by free carrier absorption in the detector cathode. In order to promote efficient generation of photoexcited carriers in the cathode, it is important to select a small bandgap material to provide low effective mass electrons and dope it heavily. Thus, the conduction band edge of the cathode will preferably be lower than the conduction band edge of the quantum wells. However, it will be noted that this is a preferred embodiment and that, for some applications, it may be preferable to use a larger bandgap or more lightly doped cathode or anode.

FIG. 6 illustrates the conduction band edge alignment for a biased device according to the present invention. The quantum wells are not doped, thus the subbands of the quantum wells do not contain free carriers. Therefore, in the present invention, the quantum wells serve as an optically inactive photoexcited electron energy filter rather than an absorber. Further, the superlattice of the present invention is resonant, and therefore transmits electrons at only small range energy levels. Electrons with energy levels above or below the resonant energy level are not transmitted unless they have sufficient energy to overcome the barrier layers. Therefore, the filter structure of the present invention is responsive only to two energy levels. The first energy levels to which it is responsive are those in that small range of energies (e.g., photon energies) sufficient to cause an electron with energies between the cathode Fermi level and the bottom of the cathode conduction band to jump to the resonance level of the biased filter. The photon energy of the detection wavelength or wavelengths will be within this range. The second energy levels to which it is responsive is the range of (photon or other) energies sufficient to cause the free carriers in the cathode to exceed the barrier energy. This characteristic of the present invention leads to two significant advantages over the prior art.

The first advantage of the filter structure of the present invention is a substantial reduction in dark current. Because the thermal energy required to induce current flow must either match the resonant energy level of the filter or exceed the barrier layers, very little dark current flows. Thermal energy is broadband energy and very little of that energy is concentrated at any one level (e.g., the level required to induce resonant current flow). Further, the filter barriers may be constructed to substantially limit the current caused when thermal energy excites electrons over the barrier energy level. This is accomplished by using barrier layers with large conduction band energy levels. Thus, substantially all of the cooling required by prior art devices may be eliminated.

The second advantage of the filter structure of the present invention is the elimination of substantially all of the high and low frequency response around the detection frequency. Because the filter structure of the present invention is responsive to energies which exceed the photon energy of the detection frequency and to a small band of photon energies around the detection frequency, the response characteristic looks like a high pass optical filter with a bandpass notch centered at the detection frequency. The higher frequency components not removed by the detector filter may then be eliminated with a simple external low pass optical filter with a cut-off frequency well above the detection frequency. This is also advantageous since the external filter does not have to be changed as the detector is tuned. When the detector is tuned, the level of the resonant filter subband moves and thus the notch moves.

In a detector according to the present invention, absorption of photons takes place in the cathode. Since the conduction band edge of the cathode may be lower than the lowest quantum energy level of the quantum wells, the cathode can be heavily doped to enhance free-carrier absorption. Without incident radiation, there is very little current which flows because the quantum well filter prevents carriers from flowing from the cathode to the anode and the quantum wells themselves are undoped and therefore cannot contribute to the dark current. When, however, sufficient energy (e.g. radiant energy) is available to the carriers in the cathode, and the detector is properly biased, the carriers are raised to a level where they resonantly tunnel from the cathode and through the quantum wells causing current to flow in the device.

Voltage controllability is important in determining the minimum energy photons which can be detected. This means that if the voltage is increased, the minimum detectable photon energy is lowered or if the voltage and is lowered the minimum detectable photon energy is increased. If the voltage is higher, the current will be higher, since there is a larger electric field across the device and the sensitivity will be higher. A device constructed according to the present invention should be tunable over a range of approximately 100 meV. A voltage controllable detector according to the present invention could be constructed, for example, using a single quantum well resonant tunneling filter with one or more subbands. See, for example, FIG. 7 and the accompanying description.

FIG. 6 is a conduction band edge diagram of the present invention when it is suitably biased for conduction, that is, the quantum levels of the quantum wells are aligned at a level above the cathode Fermi level which is equal to the photon energy of the detection frequency. Therefore, the Fermi energy must be at a level such that the difference between the Fermi energy of the cathode and the subband energy level of the resonant path is equal to the photon energy of the detection frequency. Note that the direct tunneling of the free carriers in the doped region is prevented by the long effective barrier path. The effective barrier path of detectors utilizing doped quantum well structures is not nearly so long because the doped quantum wells adjacent to the anode can contribute to the dark current and, therefore, the effective barrier thickness is smaller than in the present device. Thus, undesirable currents are more likely to tunnel through those detectors.

Note also that a device according to the present invention can be essentially transparent throughout, enabling incident radiation to enter through the anode. Incident radiation striking the anode will pass through the device substantially without loss. The photon energy of the incident radiation will be given up in the cathode where there are sufficient free electrons to absorb that energy. This is a characteristic of the optically inactive filter structure which does not absorb the radiant energy as it passes therethrough.

Figure 1:
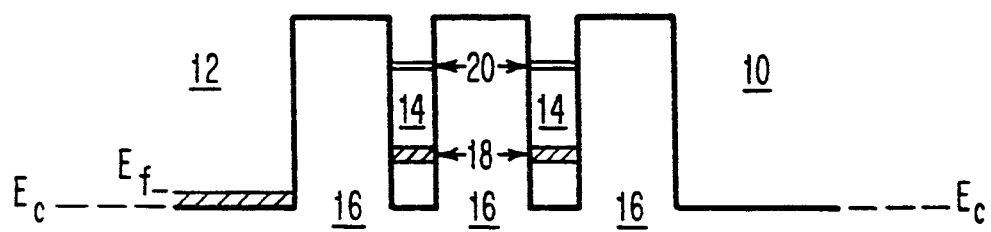
FIG. 1 illustrates a conduction band diagram of an unbiased doped superlattice structure including a doped cathode.
Figure 2:
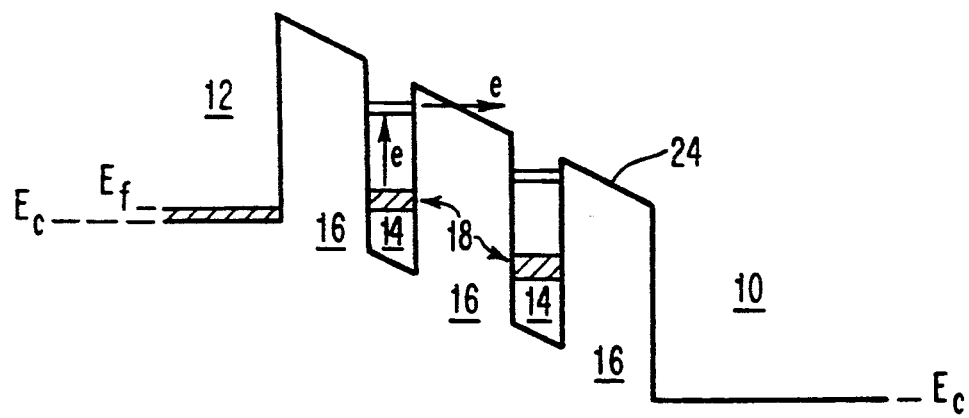
FIG. 2 illustrates a conduction band diagram of a biased doped superlattice structure including a doped cathode.
Figure 3:
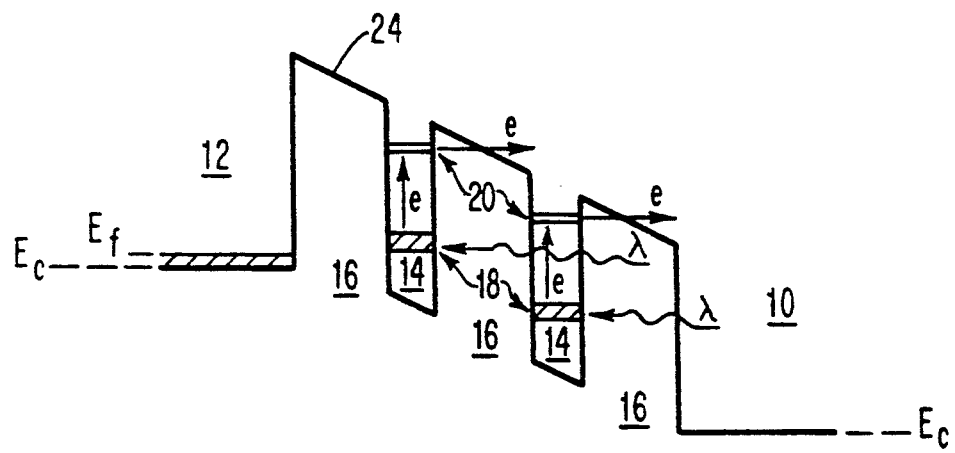
FIG. 3 illustrates a conduction band diagram of a biased doped superlattice structure including a doped cathode.
Figure 4:
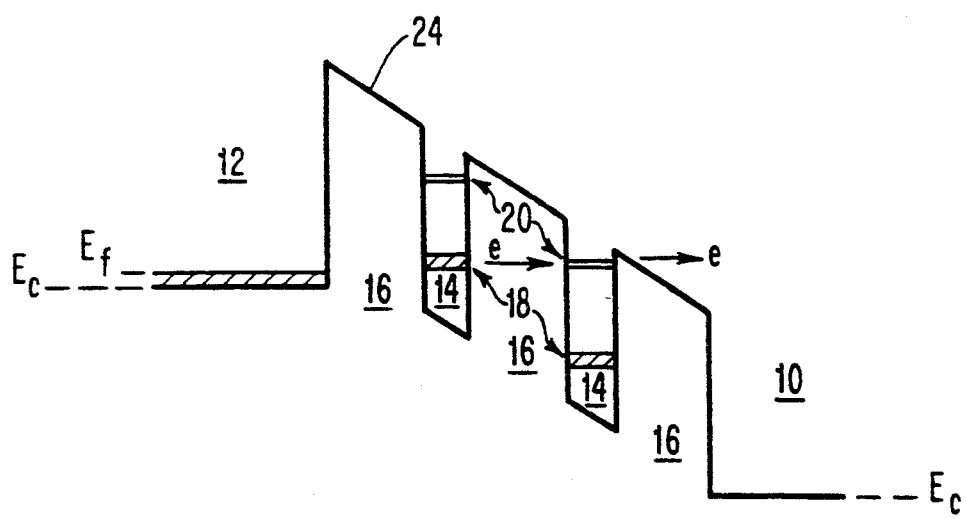
FIG. 4 illustrates a conduction band diagram of a resonantly biased doped superlattice structure including a doped collector.
Figure 5:
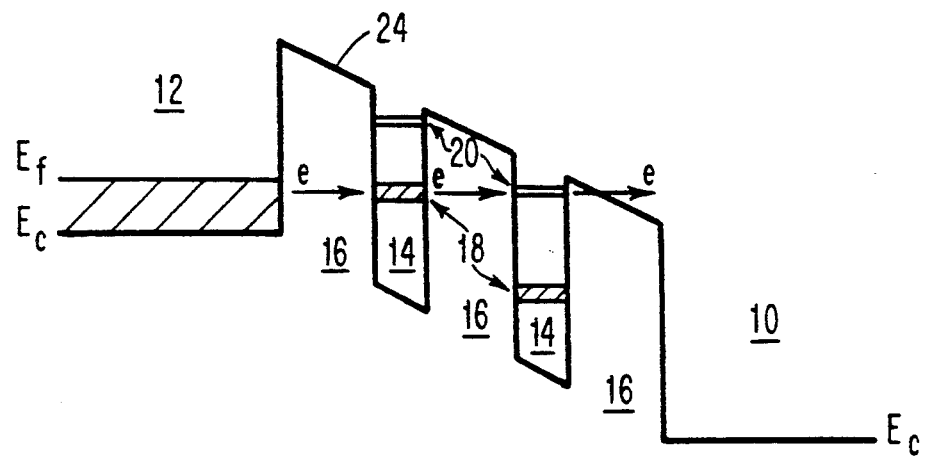
FIG. 5 illustrates a conduction band diagram of a resonantly biased doped superlattice structure with a heavily doped collector region.
Figure 7:
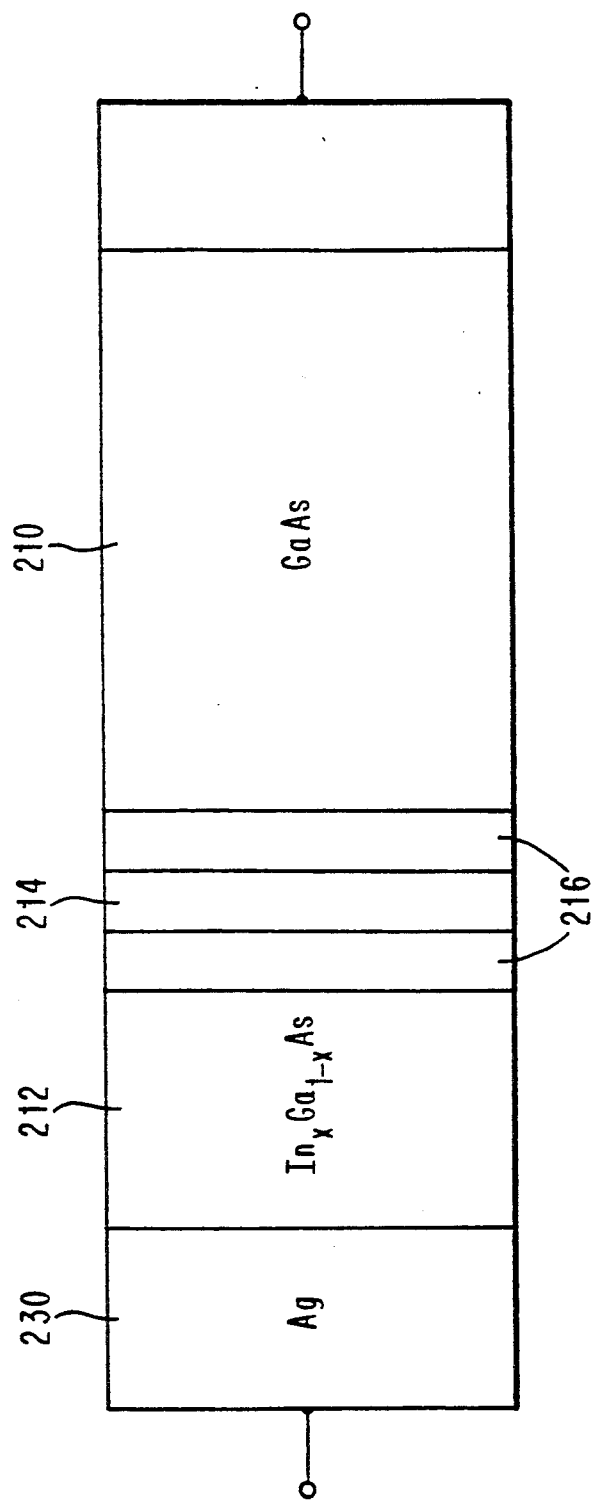
FIG. 7 illustrates a single quantum well resonant filter according to the present invention.

FIG. 7 illustrates one embodiment of the present invention incorporating a single quantum well, the cathode 210 is comprised of $In_{33}Ga_{1-x}As$ doped with Si (silicon) to about $10^{19}$ impurities per cubic centimeter while the anode 210 is $In_xGa_{1-x}As$ (indium gallium arsenide) doped with Si. The InGaAs in the anode is graded from GaAs over approximately 200Å with the InGaAs toward the filter. Over the same 200Å, the Si doping level is graded from approximately $3 \times 10^{17}$ impurities per cubic centimeter to $4 \times 10^{18}$ impurities per cubic centimeter. A metal contact 230 is attached to cathode 212. Barrier regions 216 are $Al_xGa_{1-x}As$ and the quantum well 214 is undoped GaAs. It will be noted that the filter structure illustrated in FIG. 1 may be repeated a number of times to obtain the number of quantum wells desired.

Integratable embodiments of a device according to the present invention may be manufactured by depositing all of the semiconductor layers using some type of precise epitaxial deposition process. For example, the semiconductor layers may be deposited by any one or a combination of the following processes: Vapor Phase Epitaxial deposition (VPE), Metalorganic Chemical Vapor Phase Deposition (MOCVD), Molecular Beam Epitaxy (MBE) or Metalorganic Molecular Beam Epitaxy (MOMBE). The back side (e.g., the anode) of the wafer could then be polished using any one of a number of known processes, including a methanol-bromine polish. Note, this polish step is not critical since the wavelengths are long and small irregularities on the order of one micron in the wafer surface will not be noticed. An ohmic grid may then be deposited over the polished surface, the period of the grid being at least an order of magnitude greater than the longest wavelength to be detected. A reflecting ohmic contact may be deposited on the opposite surface of the device (e.g., the cathode) to increase absorption and prevent stray radiation from inducing photo current.

If more than one device is to be manufactured, individual devices may be isolated by forming a mesa structure. Mesa structures may be formed, for example, by masking the devices and etching from the top surface to the anode.

The subbands or quantum well electron energy levels are produced by quantum spatial confinement. Thus, the subband energy is primarily a function of the width of the well and the effective mass of the electrons when they are in the well. One of ordinary skill in the art can tailor the width and composition of the quantum wells to obtain desired energy levels and the desired energy difference between the Fermi energy of the cathode and the subbands. Thus, the detection frequency or range of detection frequencies (e.g., in a tunable detector) for a device according to the present invention may be concurrently adjusted either by modifying the Fermi level of the photon absorber (cathode) or by modifying the quantum electron energy level of the resonant filter.

Further, it will be apparent to one of ordinary skill in the art that, by producing multiple electron quantum levels in the resonant filter quantum wells, the present device may be adapted to detect a number of discrete photon energy levels. Thus, it is possible to produce a response which includes multiple bandpass notches in the high pass filter characteristic of the device, with each notch corresponding to a discrete quantum level.

More particularly, in a preferred embodiment of the present invention, a 10 μm wavelength detector is formed. The substrate is an n-type GaAs layer doped to approximately $2 \times 10^{17}$ Si atoms per cubic centimeter. A first anode layer of $In_xGa_{1-x}As$ (where x is varied from 0 to 0.2) is deposited by a Molecular Beam Epitaxy process (MBE) to a thickness of 200Å to form the anode. The doping of the anode is graded from approximately $2 \times 10^{17}$ Si atoms per cubic centimeter to $4 \times 10^{18}$ Si atoms per cubic centimeter, with the largest concentration being at the filter side. A first barrier layer of $Al_{0.4}Ga_{0.6}As$ is deposited by MBE over the annode to a thickness of approximately 90Å. A first quantum well of undoped GaAs layer is deposited by MBE over the surface of the first barrier layer to a thickness of 20Å. A second barrier layer of $Al_{0.4}Ga_{0.6}As$ is deposited by MBE over the quantum well to a thickness of 90Å. In the present embodiment grading of the Si concentration may be accomplished by increasing or decreasing the impurity concentration during the MBE deposition.

Next, the cathode is deposited in two layers. The first cathode layer is a 200Å layer of $In_{0.2}Ga_{0.8}As$ doped n-type with dopant concentration of $4 \times 10^{18}$ Si atoms per cubic centimeter. The second cathode layer is a graded layer of n-type $In_xGa_{1-x}As$ (where x varies from 0.2 to 0) deposited by molecular beam epitaxy to a thickness of approximately 100Å with a dopant concentration of $4 \times 10^{18}$ Si atoms per cubic centimeter. An ohmic contact layer of n-type GaAs which is doped to a concentration of approximately $10^{19}$ impurities per cubic centimeter is deposited over the second cathode layer by molecular beam epitaxy to a thickness of approximately 1600Å. The GaAs layer is used to provide a suitable surface (ohmic contact layer) for depositing an electrode for contacting the cathode.

Figure 8:
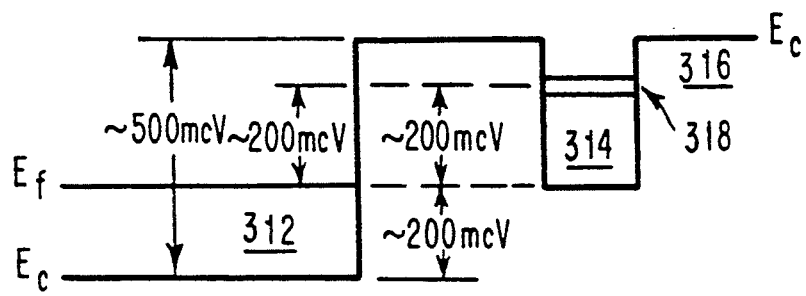
FIG. 8 illustrates a conduction band diagram of an embodiment of the present invention.
Figure 10:
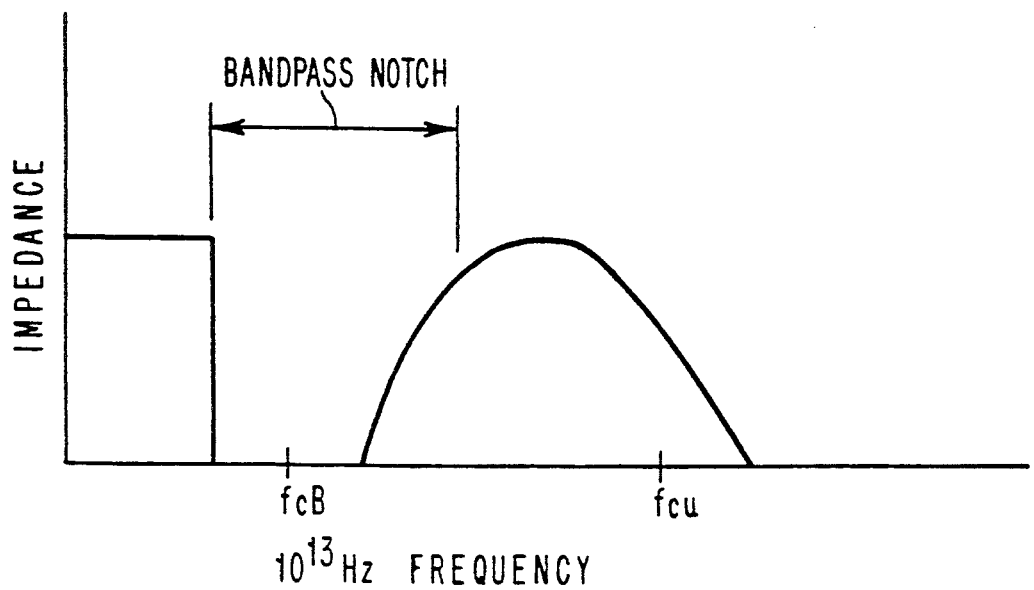
FIG. 10 is a plot of the expected impedance of the resonant filter to photoexcited electron transmission as a function of the frequency of the incident radiation for the embodiment described with respect to FIG. 8.

The conduction band diagram for this embodiment is illustrated in FIG. 8. In this embodiment, the potential difference between the cathode 312 conduction band and the barrier 316 conduction band is approximately 500 millielectron Volts (meV). The Fermi level of cathode 312 is approximately 200 meV above the cathode conduction band, or approximately 300 meV below the barrier conduction band. The conduction band of the quantum well 314 is approximately 200 meV above the conduction band of the cathode, in the unbiased state. The lattice wells, as constructed, would have at least one subband 318 at approximately 200 meV above the lattice well conduction band. Thus, in the unbiased state, the subband of the lattice well would be approximately 150 meV above the Fermi energy. In order to detect radiation in the 10 μm range, it is necessary to bias the device such that the subband level 318 of the quantum well 314 is approximately 100 meV above the Fermi level of the cathode 312. This can be accomplished by placind a DC voltage across the entire device which reduces the difference between the lattice well subband level and the Fermi level of the cathode to approximately 100 meV. In a multi-quantum well device according to this preferred embodiment, the subbands of consecutive quantum wells would be aligned at approximately 100 meV above the Fermi level of the cathode to ensure resonant tunneling of electrons excited by radiation in the 10 μm range through the device, as illustrated in FIG. 6. This device would be expected to have a high pass frequency characteristic with a band pass notch centered around approximately $10^{13}$ Hz (i.e. a photon energy of approximately 100 meV) and a high-end cut-off frequency approximately twice as large. An expected plot of the impedance of the resonant filter to photoexcited electron transmission as a function of the incident radiation frequency is illustrated in FIG. 10.

In a further preferred embodiment of the present invention, InAs-AlGa-Sb-InAlSb or GaAlSb may be used. In this embodiment InAs is the anode and cathode material, InAlSb or GaAlSb is the well material, and AlGaSb or AlSb is the barrier material. This structure could be grown on a GaSb substrate or a GaAs substrate. This embodiment is advantageous from a conduction band point of view, as it has the largest conduction band discontinuity between the cathode and the barrier of any of the devices described herein.

This embodiment may, for example, be constructed as follows to form a detector in the 10 μm wavelength range. The substrate is an n-type GaAs layer doped with silicon to approximately $10^{17}$ impurities per cubic centimeter. A first layer of InAs is deposited by a MBE process to a thickness of approximately 1000 Angstroms, forming an anode region. The doping in the anode is approximately $10^{17}$ Si atoms per cubic centimeter initially and is graded to approximately $10^{18}$ Si atoms per cubic centimeter over the last 200 Angstroms with the largest concentration being opposite the anode region. A first barrier layer of AlSb is deposited by MBE over the anode to a thickness of approximately 100 Angstroms. A first quantum well of undoped $In_{0.5}Ga_{0.5}As$ is deposited by MBE over the surface of the first barrier layer to a thickness of approximately 50 Angstroms. A second barrier layer of AlSb is deposited by MBE over the quantum well to a thickness of approximately 100 Angstroms. Next the cathode is deposited. The cathode layer is composed of InAs doped with n-type impurities (e.g. Si) to an impurity concentration of $10^{19}$ impurities per cubic centimeter. The cathode is deposited to a thickness of 2000 Angstroms by MBE.

Figure 9:
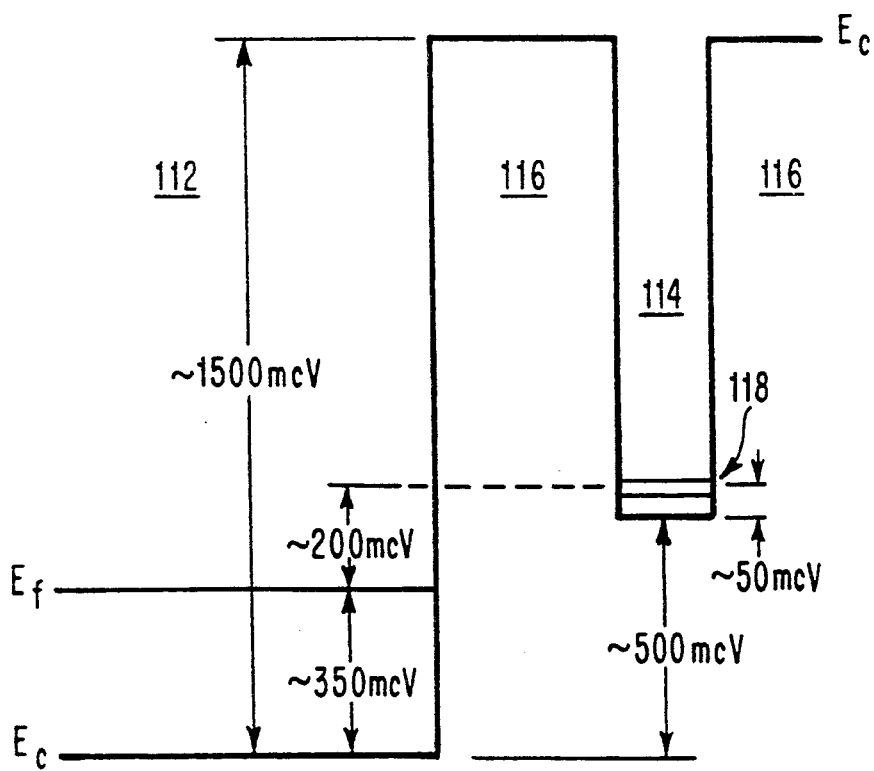
FIG. 9 illustrates a conduction band diagram of an embodiment of the present invention.
Figure 11:
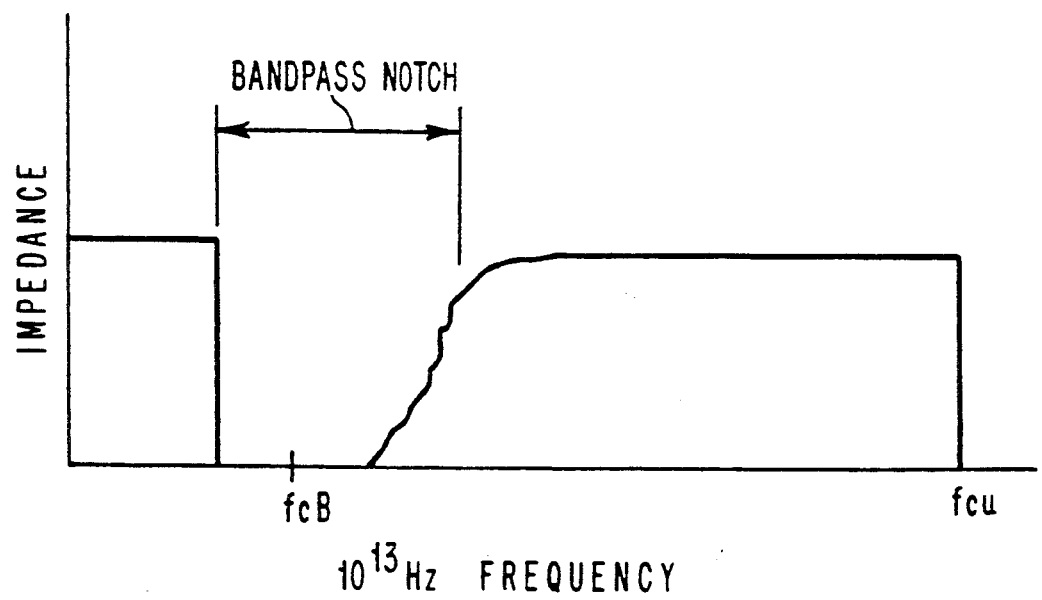
FIG. 11 is a plot of the expected impedance of the resonant filter to photoexcited electron transmission as a function of the frequency of the incident radiation for the embodiment described with respect to FIG. 9.

The conduction band diagram for this embodiment is illustrated in FIG. 9. In this embodiment, the potential difference between the cathode conduction band and the barrier conduction band is approximately 1500 millielectron Volts (meV). The Fermi level is approximately 350 meV above the cathode conduction band, or 1150 meV below the barrier conduction band. The conduction band of the quantum wells is approximately 500 meV above the conduction band of the cathode, in the unbiased state. The lattice wells, as constructed, would have at least one subband at approximately 50 meV above the lattice well conduction band. Thus, in the unbiased state, the subband of the lattice well would be approximately 200 meV above the Fermi energy. In order to detect radiation in the 10 μm range, it is necessary to bias the device such that the subband level of the quantum well is approximately 100 meV above the Fermi level of the cathode. This can be accomplished by placing a DC voltage across the entire device which reduces the difference between the lattice well subband level and the Fermi level of the cathode to approximately 100 meV. In a multi-quantum well device according to this preferred embodiment, the subbands of consecutive quantum wells would align at approximately 100 meV above the Fermi level of the cathode to ensure resonant tunneling of electrons excited by radiation in the 10 μm range through the device. This device would be expected to have a high pass frequency characteristic with a band pass notch centered around approximately $10^{13}$ Hz (i.e., a photon energy of approximately 100 meV) and a high-end cut-off frequency approximately an order of magnitude greater than the notch filter cut-off frequency. An expected plot of the impedance of the resonant filter to photoexcited electron transmission as a function of the incident radiation frequency for this embodiment is illustrated in FIG. 11.

A further preferred embodiment of the present invention may be constructed of InGaAs-InGaAs-AlInAs. In this embodiment the cathode and anode are InGaAs with approximately 60 atomic percent In, the quantum wells in the resonant tunneling filter are InGaAs with 53 atomic percent In, and the barriers are AlInAs lattice matched to the InGaAs wells and an InP substrate.

It will be apparent to those of skill in the art that the materials described herein are not an exclusive list of the materials adaptable to construct the present invention. In selecting a particular material system for this device, the following criteria may be used:

First, the band structure of the cathode and the band structure of the filter wells should be direct band gap type. In this case, the resonant current in a device according to the present invention will conserve momentum while the nonresonant current (the major component of dark current) will not. Thus, it would be advantageous to select a material wherein the momentum of electrons in the cathode is nearly the same as the available states in the well of the resonant tunneling filter. If this is the case, then the photoexcited electrons will be able to resonantly tunnel readily, producing the best photoresponse for this device.

Second, the cathode should be a material which can be heavily doped. Since free carrier absorption increases with the doping level, high doping levels will improve the quantum efficiency. However, the doping must be adjusted to optimize the absorption while still keeping the separation between the Fermi level and the resonant levels in the filter at the desired energy level.

Third, while no simple criteria can be given for the effective mass of the cathode, it is an important parameter in determining photoresponse because the free-carrier absorption is inversely proportional to the effective mass. Thus a smaller effective mass favors higher absorption. However, a smaller effective mass implies a larger Fermi energy for the same doping level. Thus, the requirement that the energy separation between the Fermi energy and the energy levels in the quantum wells be at the desired energy level for absorption (approximately 100 meV for the 10 μm wavelength range) must be balanced with the desire for higher free carrier absorption.

In taking the previously discussed criteria into consideration, it will be apparent to those of ordinary skill in the art that a number of materials will be suitable to the construction of the present invention.

In addition, while the preferred embodiment of the present invention has been described in terms of quantum wells, it will be recognized by those of ordinary skill in the art that multi-quantum wells and superlattices are substantially interchangeable for the purposes of the present invention. The only structural difference between structures referred to in the art as multi-quantum wells and as superlattices is the width of the barrier layer. Quantum wells have thick barrier layers so that the wave functions of electrons or holes in the wells do not overlap to any appreciable extent, limiting the degree of coupling between wells. Superlattices on the other hand, have very thin barriers and there is a large coupling or overlap of wave functions from adjacent wells. It will be apparent to one of ordinary skill in the art that the filter structure of the present invention may comprise either a single quantum well, a multi-quantum well structure or a superlattice structure. The essential features of the filter structure are that there be sufficient coupling between the quantum wells to ensure resonant tunneling of the carriers and that the filter structure be optically inactive passing photons with substantially no loss of energy.

It will be noted that not all doping need be eliminated from the filters to bring a device within the scope of the present invention. It is only doping levels sufficient to render the filter optically active.

While preferred embodiments of the present invention have been shown and described herein, it will be obvious to those skilled in the art that such embodiments are provided by way of example only. Numerous variations, changes, and substitutions will now occur to those skilled in the art without departing from the invention. Accordingly, it is intended that the invention be limited only by the spirit and scope of the appended claims.

What we claim is:

1. A photodetector comprising:
   an anode;
   an internally photoemissive cathode having a first conduction band edge, a first band gap, and a Fermi energy level, said cathode being sufficiently doped so that said Fermi energy level is above said first conduction band edge;
   a resonant tunneling filter means disposed between the anode and the cathode; said resonant tunneling filter means including at least one substantially non-photoemissive quantum well, said at least one quantum well having a second conduction band edge and a second band gap larger than said first band gap; the first conduction band edge and the Fermi energy level being lower than the second conduction band edge by an energy difference.

2. The photodetector of claim 1 further comprising: means for supplying a voltage difference between said anode and said cathode to change said energy difference.

3. The photodetector of claim 1 wherein said at least one quantum well is substantially undoped.

4. The photodetector of claim 1 wherein only said cathode absorbs photons to generate charge carriers.

5. The photodetector of claim 1 wherein said cathode absorbs incident radiation by intraband absorption to generate majority carriers.

6. The photodetector of claim 1 wherein said resonant tunneling filter comprises:

alternating layers of first and second semiconductor materials wherein said first and second semiconductor materials are chosen such that said second semiconductor material forms said at least one quantum well.

7. The photodetector of claim 1 wherein said resonant tunneling filter comprises:
alternating layers of first and second semiconductor materials wherein said first and second semiconductor materials are chosen such that said second semiconductor material forms said at least one quantum well, having a plurality of quantum energy levels.

8. The photodetector of claim 6 wherein:
said first semiconductor material is AlGaAs; and
said second semiconductor material is GaAs.

9. The photodetector of claim 1 wherein:
said cathode is comprised of InGaAs and said anode is comprised of GaAs.

10. The photodetector of claim 7 wherein:
said first semiconductor material is AlGaAs; and
said second semiconductor material is GaAs.

11. The photodetector of claim 7 wherein:
said cathode is comprised of InGaAs; and
said anode is comprised of GaAs.

12. A photodetector according to claim 1 wherein:
said cathode is comprised of material having a narrow direct bandgap and produces charge carriers when exposed to light having a long wavelength.

13. A photodetector according to claim 12 wherein:
said material has a direct bandgap of less than 1.5 electron Volts.

14. A photodetector according to claim 1, wherein:
said at least one quantum well includes a plurality of quantum wells having subbands located therein;
to bring the Fermi level of said cathode to a predetermined level; further comprising:
means for biasing said photodetector so that a difference between the energy level of said subbands and the Fermi level of said cathode is substantially equal to the energy level of photons to be detected.

15. A photodetector according to claim 1 wherein:
said at least one quantum well includes a plurality of quantum wells having subbands located therein;
further comprising:
means for biasing said detector so that the difference between the energy level of said subbands and said Fermia level corresponds to a range of photon energies to be detected.

* * * * *